(12) United States Patent
Chen et al.

(10) Patent No.: US 7,161,199 B2
(45) Date of Patent: Jan. 9, 2007

(54) TRANSISTOR STRUCTURE WITH STRESS MODIFICATION AND CAPACITIVE REDUCTION FEATURE IN A WIDTH DIRECTION AND METHOD THEREOF

(75) Inventors: Jian Chen, Austin, TX (US); Michael A. Mendicino, Austin, TX (US); Vance H. Adams, Austin, TX (US); Choh-Fei Yeap, San Diego, CA (US); Venkat R. Kolagunta, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/925,084

(22) Filed: Aug. 24, 2004

(65) Prior Publication Data

US 2006/0043422 A1 Mar. 2, 2006

(51) Int. Cl.
*H01L 29/76* (2006.01)
(52) U.S. Cl. .................. 257/288; 257/368; 257/386
(58) Field of Classification Search ................ 257/202, 257/288, 347, 368, 386, 369, 396, 390
See application file for complete search history.

(56) References Cited

U.S. PATENT DOCUMENTS

| | | | |
|---|---|---|---|
| 5,849,440 A | 12/1998 | Lucas et al. | |
| 5,858,830 A | 1/1999 | Yoo et al. | |
| 6,103,020 A | 8/2000 | Roberts et al. | |
| 6,197,632 B1 | 3/2001 | Bronner et al. | |
| 6,541,382 B1 | 4/2003 | Cheng et al. | |
| 6,544,854 B1* | 4/2003 | Puchner et al. | 438/308 |
| 6,605,498 B1 | 8/2003 | Murthy et al. | |
| 6,621,131 B1 | 9/2003 | Murthy et al. | |
| 6,906,360 B1* | 6/2005 | Chen et al. | 257/204 |
| 6,960,781 B1* | 11/2005 | Currie et al. | 257/19 |
| 7,015,505 B1* | 3/2006 | Yamazaki et al. | 257/57 |
| 2003/0127697 A1* | 7/2003 | Ohta et al. | 257/390 |
| 2005/0184345 A1* | 8/2005 | Lin et al. | 257/375 |
| 2006/0043500 A1* | 3/2006 | Chen et al. | 257/401 |

FOREIGN PATENT DOCUMENTS

WO PCT WO 02/45156 A2 6/2002
WO PCT WO 02/45156 A3 6/2002

OTHER PUBLICATIONS

Ernst et al., "A New Si:C Epitaxial Channel nMOSFET Architecture with Improved Drivability and Short-Channel Characteristics," *2003 Symposium on VLSI Technology Digest of Technical Papers*, 2 pps.
Gannavaram et al., "Low Temperature ($\leq 800°$ C) Recessed Junction Selective Silicon-Germanium Source/Drain Technology for sub-70 nm CMOS," *IEDM 00-437*, pp. 18.3.1-18.3.4.

(Continued)

*Primary Examiner*—T. N. Quach
(74) *Attorney, Agent, or Firm*—Michael J. Balconi-Lami; Robert L. King

(57) ABSTRACT

A transistor comprises a source and drain positioned within an active region. A gate overlies a channel area of the active region, wherein the channel region separates the source and drain. The transistor further comprises at least one stress modifier and capacitive reduction feature extending from the source to the drain and underlying the gate for reducing capacitance associated with the gate, source and drain. The at least one stress modifier and capacitive reduction feature comprises dielectric and includes a shape defined at least partially by the active region.

26 Claims, 7 Drawing Sheets

OTHER PUBLICATIONS

Ghani et al., "A 90nm High Volume Manufacturing Logic Technology Featuring Novel 45nm Gate Length Strained Silicon CMOS Transistor," 0-7803-7873-3/03 *IEEE*, 2003, 3 pgs.

Lander et al., "High Hole Mobilities in Fully-Strained $Si_{1-x}Ge_x$ Layers (0.3 < x < 0.4) and their Significance for SiGe pMOSFET Performance," *IEEE Transactions on Electron Devices*, vol. 48, No. 8, Aug. 2001, pp. 1826-1832.

Öztürk et al., "Ultra-Shallow Source/Drain Junctions for Nanoscale CMOS Using Selective Silicon-Germanium Technology," *Extended Abstracts of International Workshop on Junction Technology*, 2001, pp. 5-1-1-5-1-6.

Ouyang et al., "Built-in Longitudinal Field Effects in Sub-100-nm Graded $Si_{1-x}Ge_x$ Channel PMOSFETs," *IEEE Transactions on Electron Devices*, vol. 48, No. 6, Jun. 2001, pp. 1245-1250.

Shima et al., "<100> Channel Strained-SiGe p-MOSFET with Enhanced Hole Mobility and Lower Parasitic Resistance," *2002 Symposium on VLSI Technology Digest of Technical Papers*, pp. 94-95.

Sleight et al., "Stress Induced Defects and Transistor Leakage for Shallow Trench Isolated SOI," *IEEE Electron Device Letters*, vol. 20, No. 5, May 1999, pp. 248-250.

Streit et al., "High Performance HBT's with Built-In Base Fields: Exponentially-Graded Doping vs. Graded Composition," *IEEE 0-7803-0491-8*, 1991, pp. 325-333.

* cited by examiner

TRANSISTOR STRUCTURE WITH STRESS MODIFICATION AND CAPACITIVE REDUCTION FEATURE IN A WIDTH DIRECTION AND METHOD THEREOF

CROSS-REFERENCE TO RELATED APPLICATIONS

This application is related to an application Ser. No. 10/925,057 entitled "Transistor Structure With Stress Modification and Capacitive Reduction Feature in a Channel Direction and Method Thereof", Chen et al., filed concurrently herewith and incorporated herein in its entirety by reference.

BACKGROUND

The present disclosures relate generally to semiconductor devices, and more particularly, to a transistor structure and method of making a transistor structure with stress modification and capacitive reduction features in a width direction.

A narrow width PFET drive current enhancement on the order of approximately 15 to 40 percent (15–40%) has been observed with narrow width PFET devices on a <100> orientation SOI substrate. Such an enhancement is believed related to a stress induced mobility enhancement. However, there exist one or more limiting factors that prevent taking advantage of this drive current improvement. First, in a typical high performance product in 0.13 micron technology, a significant amount of PFET transistors are designed at a relatively wide width, for example, having a peak PFET width distribution around 3.3 µm. As a result, such wide width PFET devices are unable to benefit from the narrow width PFET enhancement. Secondly, to enable a circuit to function, an NFET to PFET drive current ratio should be maintained within a certain range, i.e., typically around 2. Too strong of a PFET drive current may not be a good thing for the circuit, since the strong PFET drive current has the potential to cause circuit failure.

Accordingly, it would be desirable to provide an improved transistor structure and method of making the same for overcoming the problems in the art.

SUMMARY

According to one embodiment, a transistor comprises a source and drain positioned within an active region. A gate overlies a channel area of the active region, wherein the channel region separates the source and drain. The transistor further comprises at least one stress modifier and capacitive reduction feature extending from the source to the drain and underlying the gate for reducing capacitance associated with the gate, source and drain. The at least one stress modifier and capacitive reduction feature comprises dielectric and includes a shape defined at least partially by the active region.

BRIEF DESCRIPTION OF THE DRAWINGS

The embodiments of the present disclosure are illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figures 1, 2:
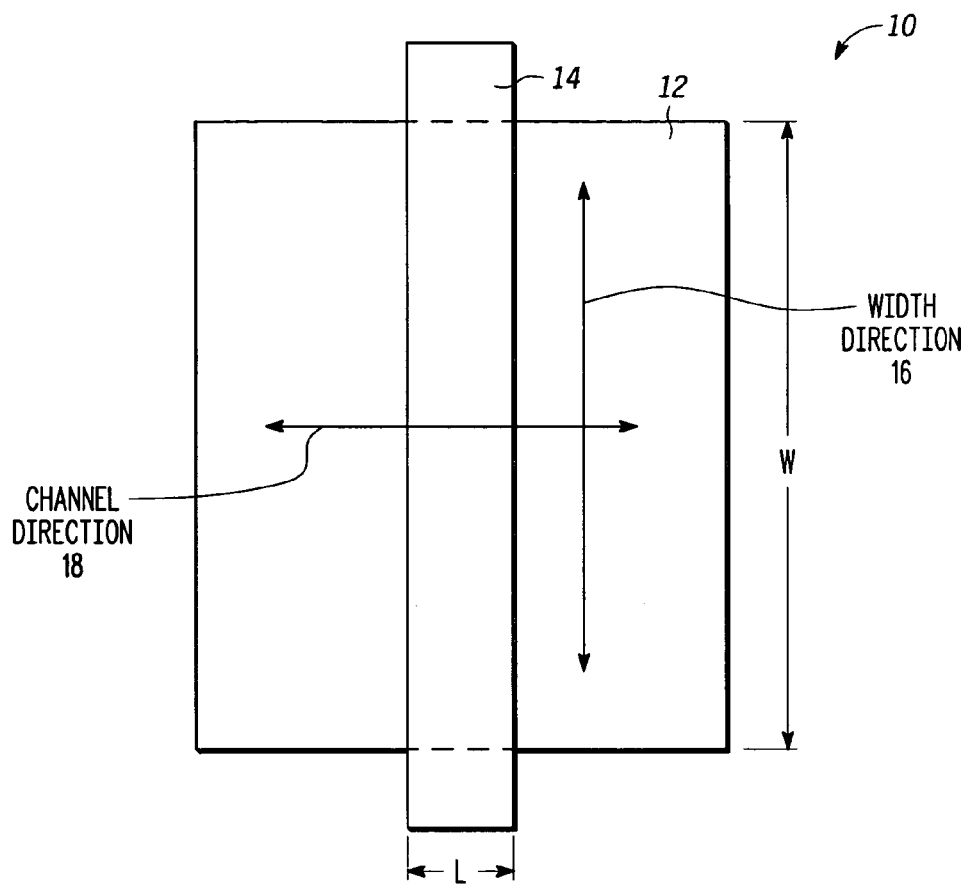
FIG. 1 is a top view of a CMOS transistor illustrating a channel direction and width direction as is known in the art.
FIG. 2 is a table view of stress response sensitivity characteristics for various channel orientations and device types.

FIG. 1 is a top view of a CMOS transistor 10 illustrating a channel direction and width direction as is known in the art. In particular CMOS transistor 10 includes an active region 12 and a gate electrode 14, with an underlying gate dielectric (not shown). Active region 12 is characterized by a width dimension W extending in a width direction, the width direction being indicated by reference numeral 16. In addition, active region 12 comprises any suitable semiconductor material. Gate electrode 14 is characterized by a length dimension L extending in a channel direction, the channel direction being indicated by reference numeral 18.

FIG. 2 is a table view of stress response sensitivity characteristics for various channel orientations and device types. The table is based on short channel device behavior. In particular, the table 20 of FIG. 2 includes columns of channel orientation 22, device type 24, favorable channel stress 26, and favorable width stress 28. For a channel orientation of <110>, an NMOS device performs best under tensile stress in the channel direction. In addition, for a channel orientation of <110>, the NMOS device performance has a relatively small sensitivity to stress in width direction. For a channel orientation of <110>, a PMOS device performs best under compressive stress in the channel direction and under tensile stress in width direction. For a channel orientation of <100>, an NMOS device performs best under tensile stress in the channel direction and has a relatively small sensitivity to stress in width direction. Lastly, for a channel orientation of <100>, a PMOS device performance demonstrates a relatively small sensitivity to stress in the channel direction and does respond favorably to small compressive stress in the width direction.

Figure 3:
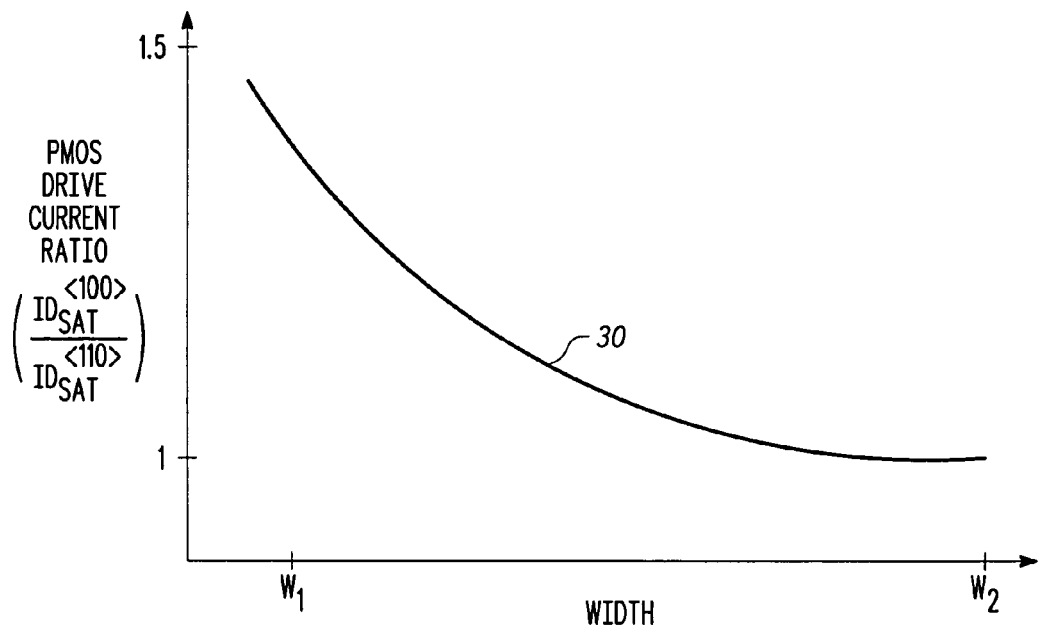
FIG. 3 is a characteristic curve representation of a PMOS drive current ratio of a <100> transistor channel orientation over a <110> transistor channel orientation across different transistor widths.

FIG. 3 is a characteristic curve representation of a PMOS drive current ratio of a <100> transistor channel orientation over a <110> transistor channel orientation across different transistor widths. The PMOS drive current ratio is defined as the ratio of drive current $ID_{SAT}$ for a device having a <100> channel orientation to drive current $ID_{SAT}$ for a device having a <110> channel orientation. The width axis extends from a small width W1 to a larger width W2. Accordingly, curve 30 illustrates that the drive current ratio increases with reduced device widths. For example, at narrow widths, the improvement in drive current can be on the order of 50% or more.

Figure 4:
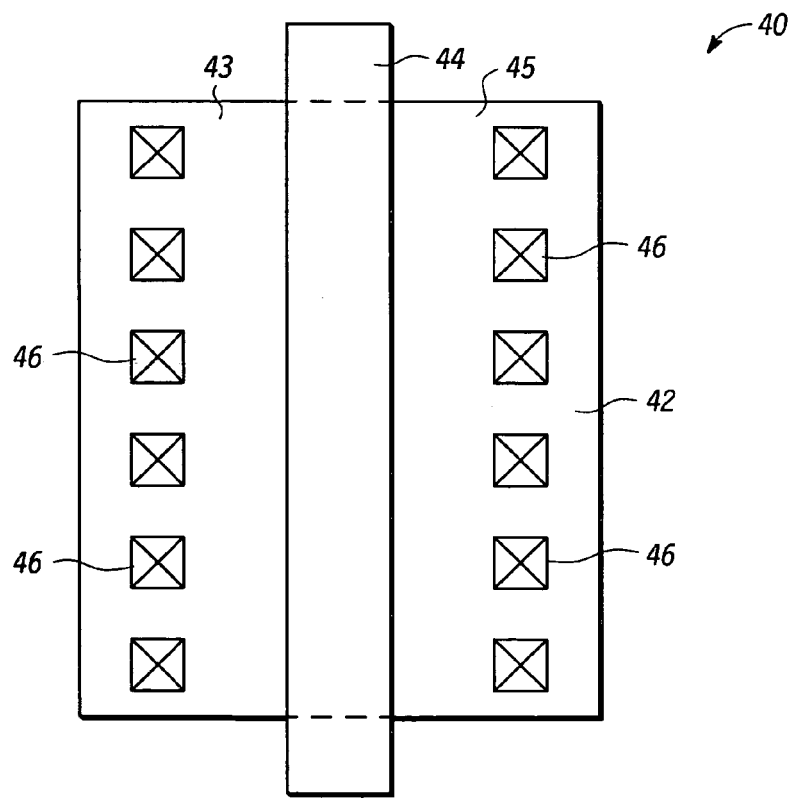
FIG. 4 is a top view of a typical CMOS transistor structure known in the art.

FIG. 4 is a top view of a typical CMOS transistor structure known in the art. In particular CMOS transistor 40 includes an active region 42 and a gate electrode 44, with an underlying gate dielectric (not shown). Active region 42 is characterized by a width dimension W extending in a width direction. In addition, active region 42 comprises any suitable semiconductor material. Gate electrode 44 is characterized by a length dimension L extending in a channel direction. Transistor 40 also includes contacts 46 for making contact with respective source and drain regions, 43 and 45, respectively. With respect to the CMOS transistor 40, it would be desirable to optimize the same from a performance stand point.

Figure 5:
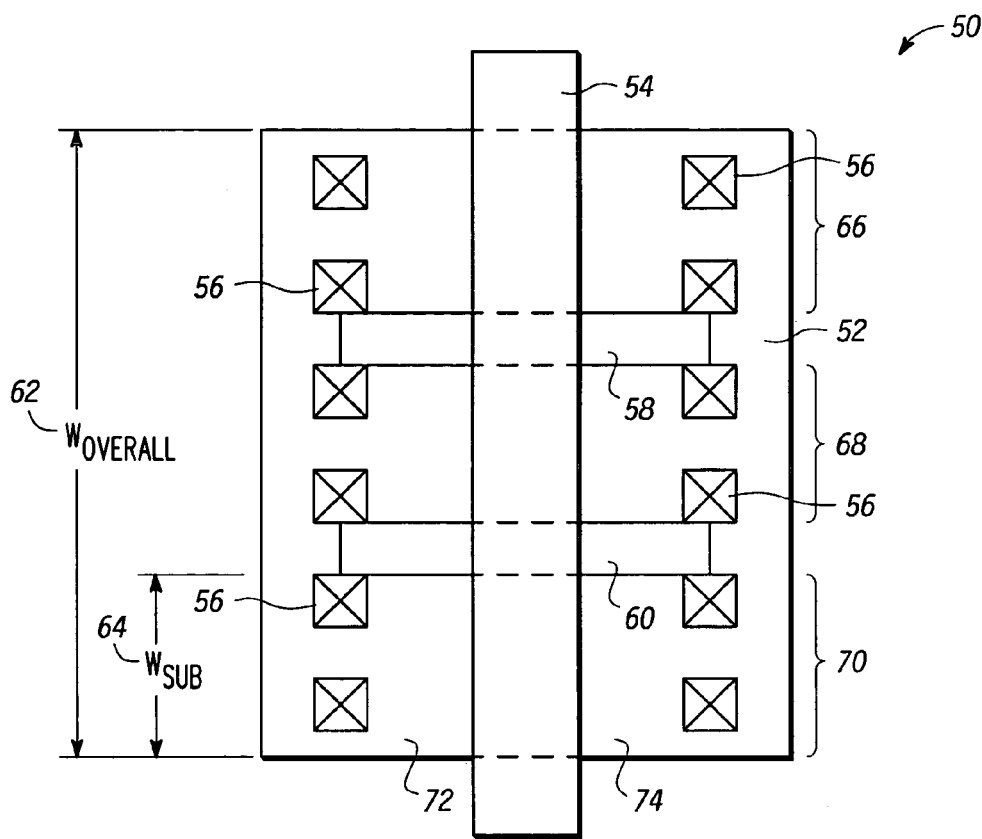
FIG. 5 is a top view of a CMOS transistor structure with a stress modification and capacitive reduction feature in a width direction according to one embodiment of the present disclosure.

FIG. 5 is a top view of a CMOS transistor structure with a stress modification and capacitive reduction feature in a width direction according to one embodiment of the present disclosure. In particular CMOS transistor 50 includes an active region 52 and a gate electrode 54, with an underlying gate dielectric (not shown). In addition, active region 52 comprises any suitable semiconductor material. Gate electrode 54 is characterized by a length dimension L extending in a channel direction. Transistor 50 also includes contacts 56 for making contact with respective source and drain regions, 72 and 74, respectively, of active region 52. With respect to the CMOS transistor 50, the same has been optimized from a performance stand point as further discussed herein.

Optimization of CMOS transistor 50 includes the addition of stress modifier and capacitive reduction features (58,60), wherein the features provide a modification of stresses in the width direction. In other words, active region 52 is characterized by a width dimension $W_{OVERALL}$ indicated by reference numeral 62 and extending in the width direction. Active region 52 is divided into multiple segments, for example, first, second, and third segments 66, 68, and 70, respectively. The segments are characterized by a width, $W_{SUB}$, as indicated by reference numeral 64. The width $W_{SUB}$ is less than the overall width $W_{OVERALL}$. In addition, the stress modifier and capacitive reduction features (58,60) extend between the source and drain regions (72,74) of active area 52 and underlie the gate electrode 54 and gate dielectric (not shown).

In one embodiment, stress modifier and capacitive reduction features (58,60) replace corresponding regions of active area 52 that have been previously removed by suitable etch techniques, for example, trench etch techniques. Stress modifier and capacitive reduction features (58,60) include a trench fill material selected according to a desired stress modification for a particular transistor application, either compressive or tensile stress modification. For example, in one embodiment, the trench fill material includes oxide for providing a compressive stress modification. In another embodiment, the trench fill material includes a nitride for providing a tensile stress modification.

According to another embodiment, a transistor comprises a source and drain positioned within an active region. A gate overlies a channel area of the active region, wherein the channel region separates the source and drain. The transistor further comprises at least one stress modifier and capacitive reduction feature extending from the source to the drain and underlying the gate for reducing capacitance associated with the gate, source and drain. The at least one stress modifier and capacitive reduction feature comprises dielectric and includes a shape defined at least partially by the active region. The at least one stress modifier and capacitive reduction feature modifies stress in a width direction of the channel area. In one embodiment, the width direction of the channel area is a <100> crystal orientation, wherein the dielectric is one that exerts a compressive stress on the active region. In addition, the dielectric that exerts a compressive stress on the active region is an oxide.

In another embodiment, the width direction of the channel area is a <110> crystal orientation, wherein the dielectric is one that exerts a tensile stress on the active region. In addition, the dielectric that exerts a tensile stress on the active region is silicon nitride.

In yet another embodiment, a total number of the at least one stress modifier and capacitive reduction feature is dependent on an overall width of the active region. In addition, the total number of the at least one stress modifier and capacitive reduction feature is further dependent on an optimum sub-width of the active region. Furthermore, the optimum sub-width is determined by a calculation of optimum performance metrics. Moreover, in another embodiment, the at least one stress modifier and capacitive reduction feature comprises a region previously occupied by the active region.

Figure 6:
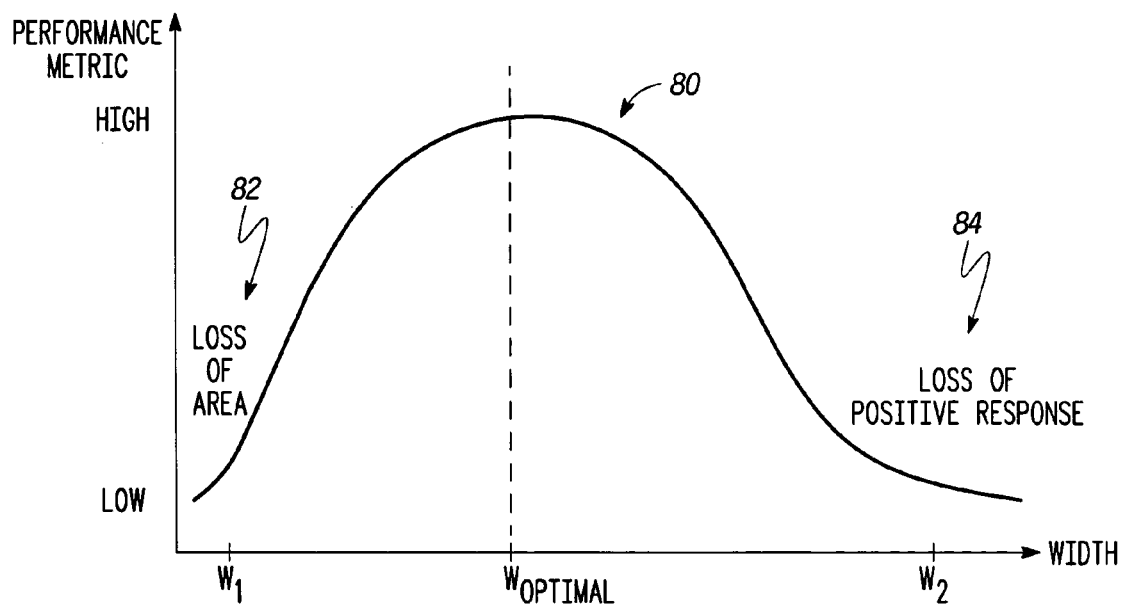
FIG. 6 is a characteristic curve representation of performance metric versus width of a segment of the active region incorporating the stress modification and capacitive reduction feature according to one embodiment of the present disclosure.

FIG. 6 is a characteristic curve representation of performance metric versus width of a segment of the active region incorporating the stress modification and capacitive reduction feature according to one embodiment of the present disclosure. In particular, the performance metric axis extends from a low performance to a high performance. The width axis extends from a small width W1 to a larger width W2, including an optimal width $W_{OPTIMAL}$. Performance response curve 80 illustrates that for a segment width ($W_{SUB}$) that is selected smaller than an optimal segment width ($W_{OPTIMAL}$) and located in a region as indicated by reference numeral 82, the device performance suffers from a loss of active device area. In addition, performance response curve 80 illustrates that for a segment width ($W_{SUB}$) that is selected larger than an optimal segment width ($W_{OPTIMAL}$) and located in a region as indicated by reference numeral 84, the device performance suffers a loss of positive response.

Figure 7:
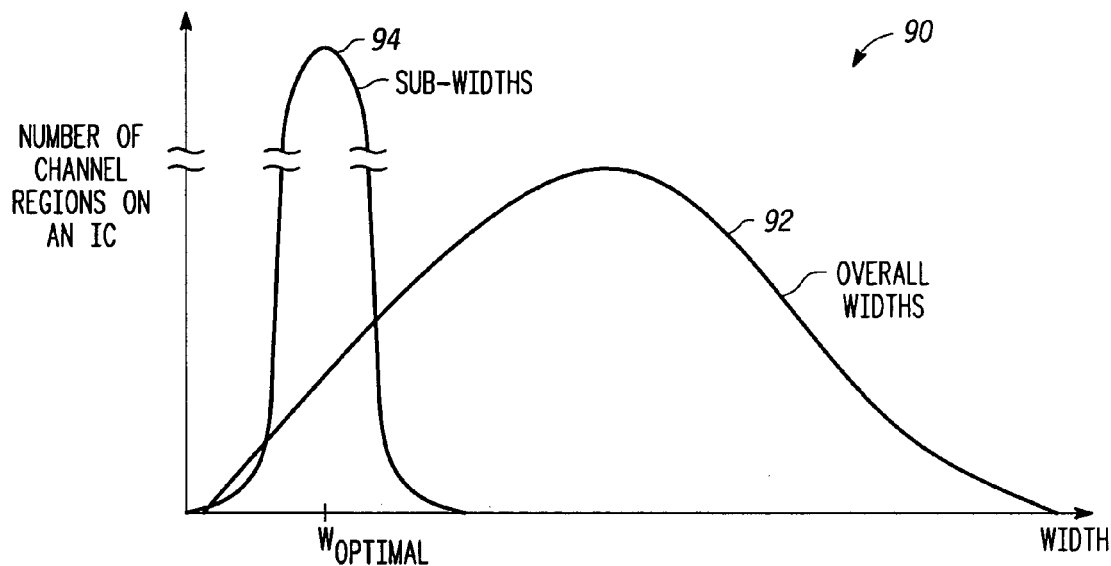
FIG. 7 is a characteristic curve representation of a number of channel regions per integrated circuit versus width of transistor devices on the integrated circuit for (a) a typical transistor structure and (b) an optimized transistor structure, the optimized transistor structure incorporating the stress modification and capacitive reduction feature according to one embodiment of the present disclosure.

FIG. 7 is a characteristic curve representation 90 of a number of channel regions per integrated circuit versus width of transistor devices on the integrated circuit for (a) a typical transistor structure and (b) an optimized transistor structure, the optimized transistor structure incorporating stress modification and capacitive reduction features according to the embodiments of the present disclosure. For a typical transistor structure, curve 92 indicates that there exists a wide distribution of overall widths of transistor structures for a typical integrated circuit. For an optimized transistor structure, curve 94 indicates that there exists a narrower distribution of overall widths of transistor structures for the integrated circuit including stress modification features according to the embodiments of the present disclosure. The narrower distribution of overall widths of transistor structures of curve 94 is centered about the optimal width ($W_{OPTIMAL}$).

Figure 8:
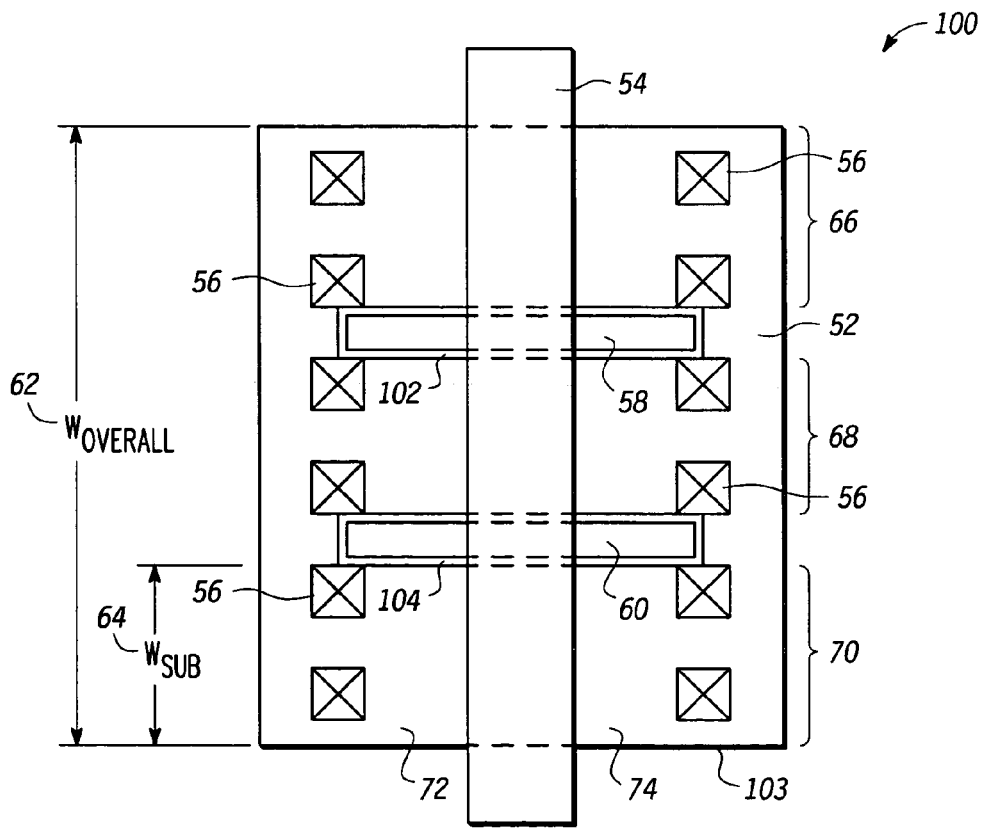
FIG. 8 is a top view of a CMOS transistor structure with a stress modification and capacitive reduction feature in a width direction including a stress modifying liner according to another embodiment of the present disclosure.

FIG. 8 is a top view of a CMOS transistor structure 100 with a stress modification and capacitive reduction feature in a width direction including a stress modifying liner or liners according to another embodiment of the present disclosure. CMOS transistor structure 100 is similar to that shown and described herein above with respect to FIG. 5, with the following difference. CMOS transistor structure 100 includes stress modifying liners (102, 103, and 104) adjacent a portion of active region 52. In one embodiment, stress modifying liners 102 and 104 include thick oxide liners disposed about a perimeter of a respective stress modification and capacitive reduction feature. Stress modifying liners 102 and 104 further comprise, for example, a thickness on the order of 100–400 angstroms. In addition, stress modifying liner 103 includes a thin oxide liner disposed about a perimeter of active region 52 and further comprises, for example, a thickness on the order of 0–100 angstroms.

Accordingly, in another embodiment, the active region further comprises at least two stress modifying liners, a first liner surrounding at least a portion of a periphery of the active region and a second liner surrounding at least a portion of a surface of the at least one stress modifier and capacitive reduction feature. In another embodiment, the second liner is substantially thicker in cross-sectional width than the first liner for exerting a substantially greater stress than the first liner. Furthermore, the first liner and the second liner can further comprise an oxide.

Figure 9:
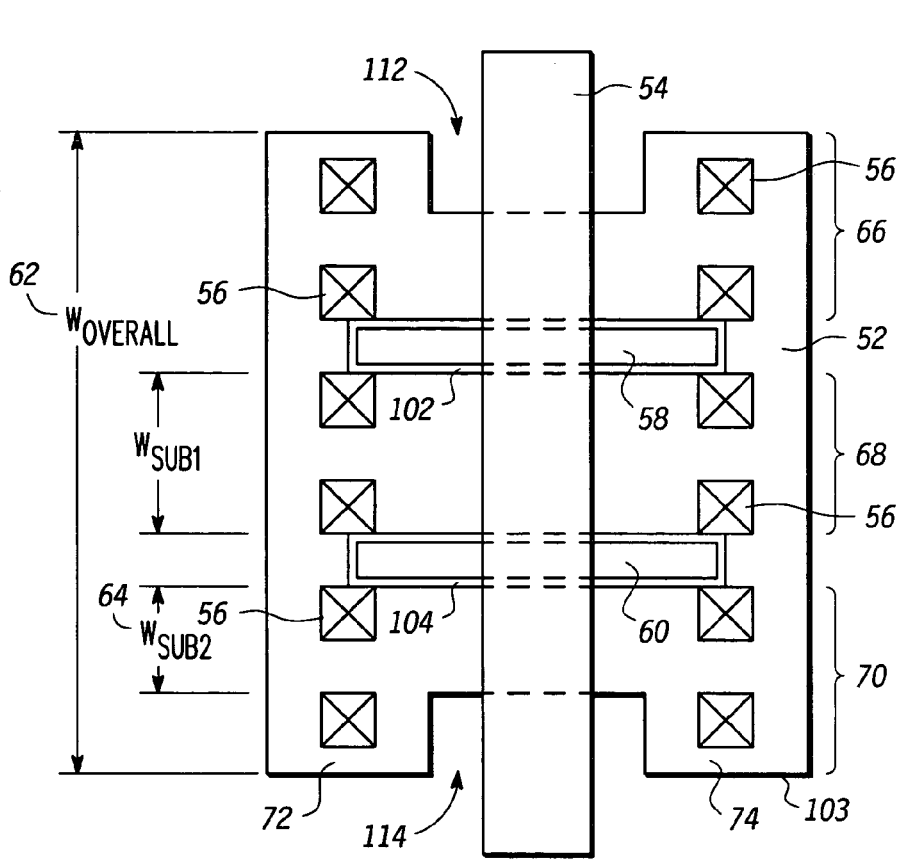
FIG. 9 is a top view of a CMOS transistor structure with a stress modification and capacitive reduction feature in a width direction including a stress modifying liner and a notch according to another embodiment of the present disclosure.

FIG. 9 is a top view of a CMOS transistor structure 110 with a stress modification and capacitive reduction feature in a width direction including one or more stress modifying liners or notches according to another embodiment of the present disclosure. CMOS transistor structure 110 is similar to that shown and described herein above with respect to FIG. 8, with the following difference. CMOS transistor structure 110 includes stress modifying notches (112,114) in active region 52. In particular, notches (112,114) are disposed in opposite ends of active region 52, wherein each notch spans across a portion of the channel region of CMOS transistor structure 110. Accordingly, in one embodiment, the at least one stress modifier and capacitive reduction feature further comprises a notch positioned around at least one side of the active area in close proximity to the gate. In addition, the notch is positioned on two opposing sides of the active area and substantially symmetric to the gate. Moreover, notches (112,114) reduce a total width dimension of the active region for addressing various chip functionality issues and/or problems as may be required for a given CMOS transistor structure application.

Figure 10:
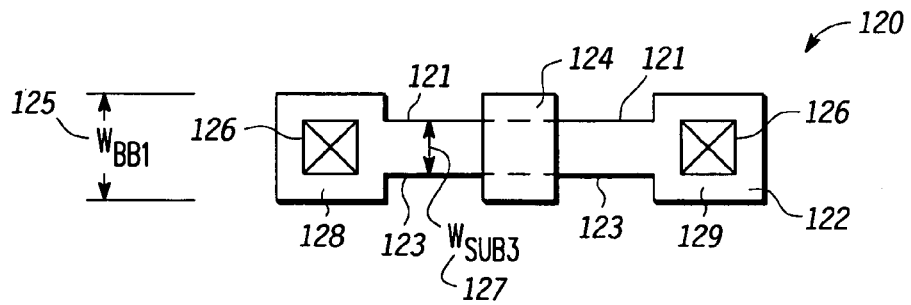
FIG. 10 is a top view of a CMOS transistor building block structure with a stress modification and capacitive reduction feature in a width direction according to another embodiment of the present disclosure.

FIG. 10 is a top view of a CMOS transistor building block structure 120 with a stress modification and capacitive reduction feature in a width direction according to another embodiment of the present disclosure. Transistor building block structure 120 includes an active semiconductor region, generally indicated by reference numeral 122, and having side perimeters 121 and 123. Overlying the active semiconductor region 120 is a gate electrode 124, with an underlying gate dielectric (not shown). Active semiconductor region 122 comprises any suitable semiconductor material for a given transistor application. Gate electrode 124 is characterized by a length dimension extending in the channel direction. Transistor building block 120 further includes contacts 126 for making contact with respective source and drain regions, 128 and 129, of active region 122. With respect to the building block 120, the same has been optimized from a performance point of view as further discussed herein.

Optimization of CMOS transistor building block 120 includes the addition of stress modifier and capacitive reduction features, wherein the features provide a modification of stresses and capacitive reduction in the width direction. In other words, active region 122 of building block 120 is characterized by a building block width dimension $W_{BB1}$ indicated by reference numeral 125 and extending in the width direction. The active region 122 is further characterized by a width, $W_{SUB3}$, as indicated by reference numeral 127. The width $W_{SUB3}$ is less than the building block width $W_{BB1}$. In addition, the stress modifier and capacitive reduction features extend between the source and drain regions (128,129) of active area 122 and further underlie the gate electrode 124 and gate dielectric (not shown), as will be explained further herein below with respect to FIG. 12.

In one embodiment, stress modifier and capacitive reduction features replace corresponding regions of active area 122 that have been previously removed by suitable etch techniques, for example, trench etch techniques. Stress modifier and capacitive reduction features include trench fill material that has been selected according to a desired stress modification for a particular transistor application, either compressive or tensile stress modification. For example, in one embodiment, the trench fill material includes oxide for providing a compressive stress modification. In another embodiment, the trench fill material includes a nitride for providing a tensile stress modification.

Figure 11:
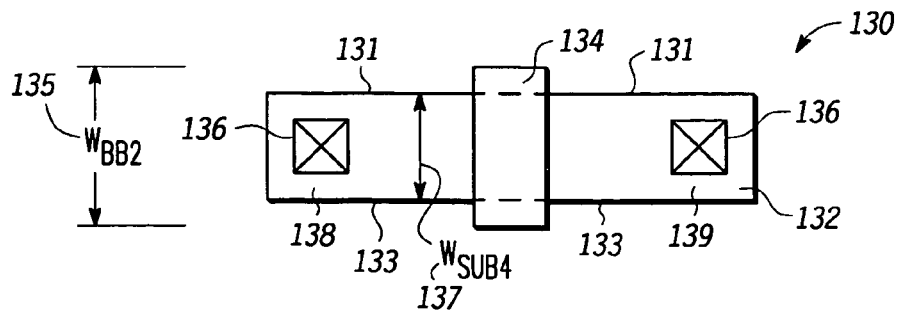
FIG. 11 is a top view of a CMOS transistor building block structure with a stress modification and capacitive reduction feature in a width direction according to yet another embodiment of the present disclosure.

FIG. 11 is a top view of a CMOS transistor building block structure 130 with a stress modification and capacitive reduction feature in a width direction according to yet another embodiment of the present disclosure. Transistor building block structure 130 includes an active semiconductor region, generally indicated by reference numeral 132, and having side perimeters 131 and 133. Overlying the active semiconductor region 130 is a gate electrode 134, with an underlying gate dielectric (not shown). Active semiconductor region 132 comprises any suitable semiconductor material for a given transistor application. Gate electrode 134 is characterized by a length dimension extending in the channel direction. Transistor building block 130 further includes contacts 136 for making contact with respective source and drain regions, 138 and 139, of active region 132. With respect to the building block 130, the same has been optimized from a performance point of view as further discussed herein.

Optimization of CMOS transistor building block 130 includes the addition of stress modifier and capacitive reduction features, wherein the features provide a modification of stresses and capacitive reduction in the width direction. In other words, active region 132 of building block 130 is characterized by a building block width dimension $W_{BB2}$ indicated by reference numeral 135 and extending in the width direction. The active region 132 is further characterized by a width, $W_{SUB4}$, as indicated by reference numeral 137. The width $W_{SUB3}$ is equal to the building block width $W_{BB2}$. In addition, the stress modifier and capacitive reduction features extend between the source and drain regions (138,139) of active area 122 and further underlie the gate electrode 124 and gate dielectric (not shown), as will be explained further herein below with respect to FIG. 13.

Figure 12:
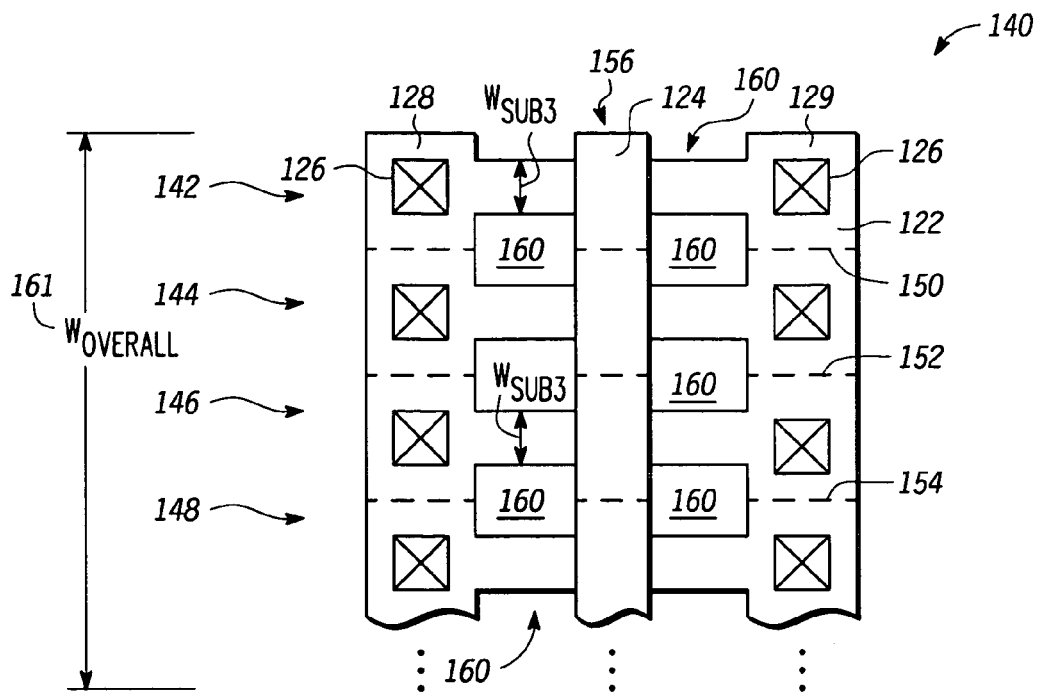
FIG. 12 is a top view of a CMOS transistor structure fabricated using the building block structure of FIG. 10 having a stress modification and capacitive reduction feature in a width direction according to another embodiment of the present disclosure.

FIG. 12 is a top view of a CMOS transistor structure 140 fabricated using the building block structure 120 of FIG. 10 having a stress modification and capacitive reduction feature in a width direction according to another embodiment of the present disclosure. Transistor structure 140 includes a number of building blocks 142, 144, 146, 148, and so on, wherein the total number of building blocks is determined by the requirements of a given transistor application. In one embodiment, each of building blocks 142, 144, 146 and 148 comprise the building block structure 120 of FIG. 10. In addition, each of the building blocks 142, 144, 146 and 148 have a sub-width, $W_{SUB3}$. As shown, building block 142 is physically joined to building block 144 at a portion of the active region and gate electrode of each, further as illustrated by the dashed line 150. Similarly, building block 144 is physically joined to building block 146 at a portion of the active region and gate electrode of each, further as illustrated by the dashed line 152. Still further, building block 146 is physically joined to building block 148 at a portion of the active region and gate electrode of each, further as illustrated by the dashed line 154. Transistor structure 140 can further include additional building blocks, as illustrated by the series of dots " . . . ". Lastly, the overall width dimension of transistor structure 140 is represented by $W_{OVERALL}$, indicated by reference numeral 161.

With respect to building blocks 142 and 144, a perimeter of building block 142 and a perimeter of building block 144 form at least one stress modifier and capacitive reduction feature, generally indicated by reference numeral 160. Feature 160 extends underneath the gate electrode 156 of transistor structure 140, between the perimeters of building blocks 142 and 144. A perimeter of building block 144 and a perimeter of building block 146 also form at least one stress modifier and capacitive reduction feature 160. Feature 160 also extends underneath the gate electrode 156, between the perimeters of building blocks 144 and 146. Still further, a perimeter of building block 146 and a perimeter of building block 148 also form at least one stress modifier and capacitive reduction feature 160. Feature 160 extends underneath the gate electrode 156, between the perimeters of building blocks 146 and 148. In a similar manner, additional stress modifier and capacitive reduction features are formed for additional building blocks, as represented by the series of dots " . . . ".

According to another embodiment of the present disclosure, the transistor as discussed herein further comprises at least two predetermined transistor building blocks, each of the at least two predetermined transistor building blocks having a sub-width and a side perimeter. When any two of the at least two predetermined transistor building blocks are physically joined, the side perimeter thereof forms the at least one stress modifier and capacitive reduction feature. The active region further comprises at least two stress modifying liners, a first liner surrounding at least a portion of a periphery of the active region and a second liner surrounding at least a portion of a surface of the at least one stress modifier and capacitive reduction feature. In one embodiment, the width direction of the channel area is a <100> crystal orientation. In another embodiment, the width direction of the channel area is a <110> crystal orientation. Furthermore, the side perimeter of at least one of the two predetermined transistor building blocks further comprises a notch that determine in part the sub-width.

Figure 13:
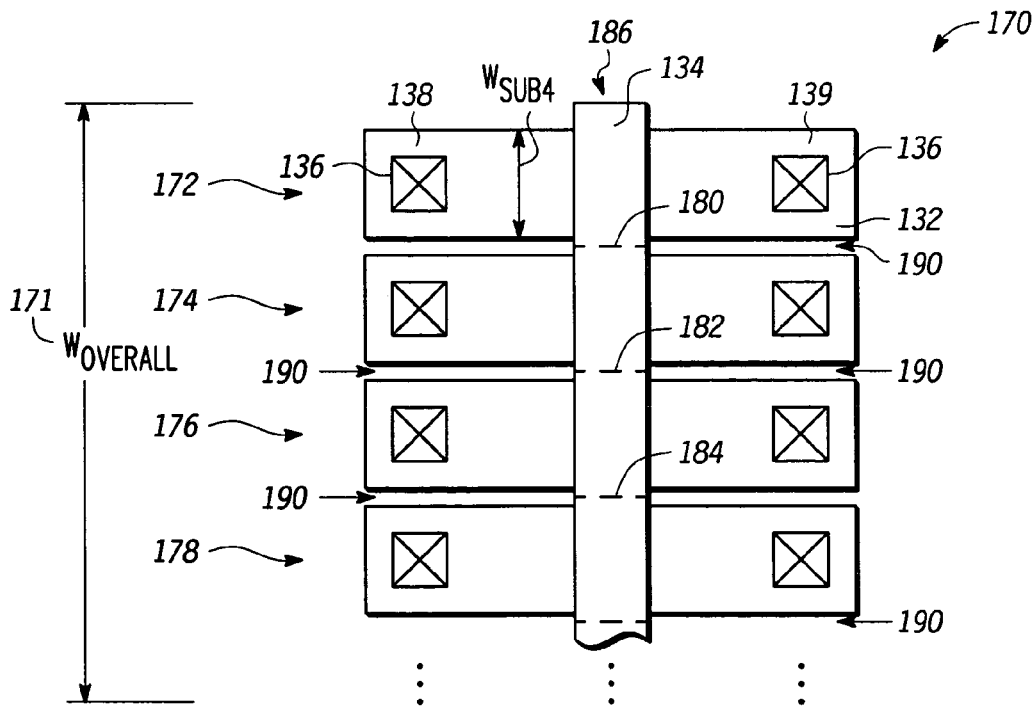
FIG. 13 is a top view of a CMOS transistor structure fabricated using the building block structure of FIG. 11 having a stress modification and capacitive reduction feature in a width direction according to another embodiment of the present disclosure.

FIG. 13 is a top view of a CMOS transistor structure fabricated using the building block structure of FIG. 11 having a stress modification and capacitive reduction feature in a width direction according to another embodiment of the present disclosure. Transistor structure 170 includes a number of building blocks 172, 174, 176, 178, and so on, wherein the total number of building blocks is determined by the requirements of a given transistor application. In one embodiment, each of building blocks 172, 174, 176 and 178 comprise the building block structure 130 of FIG. 11. In addition, each of the building blocks 172, 174, 176 and 178 have a sub-width, $W_{SUB4}$. As shown, building block 172 is physically joined to building block 174 at a portion of the gate electrode of each, further as illustrated by the dashed line 180. Similarly, building block 174 is physically joined to building block 176 at a portion of the gate electrode of each, further as illustrated by the dashed line 182. Still further, building block 176 is physically joined to building block 178 at a portion of the gate electrode of each, further as illustrated by the dashed line 184. Transistor structure 170 can further include additional building blocks, as illustrated by the series of dots " . . . ". Lastly, the overall width dimension of transistor structure 170 is represented by $W_{OVERALL}$, indicated by reference numeral 171.

With respect to building blocks 172 and 174, a perimeter of building block 172 and a perimeter of building block 174 form at least one stress modifier and capacitive reduction feature, generally indicated by reference numeral 190. Feature 190 extends underneath the gate electrode 186 of transistor structure 170, between the perimeters of building blocks 172 and 174. A perimeter of building block 174 and a perimeter of building block 176 also form at least one stress modifier and capacitive reduction feature 190. Feature 190 also extends underneath the gate electrode 186, between the perimeters of building blocks 174 and 176. Still further, a perimeter of building block 176 and a perimeter of building block 178 also form at least one stress modifier and capacitive reduction feature 190. Feature 190 extends underneath the gate electrode 186, between the perimeters of building blocks 176 and 178. In a similar manner, additional stress modifier and capacitive reduction features are formed for additional building blocks, as represented by the series of dots " . . . ". Furthermore, the contacts 136 located in the source region 138 or 139 are strapped together at backend interconnect circuitry (not shown) for the particular transistor structure application. Likewise, the contacts 136 located in the drain region 139 or 138 are also strapped together by the backend interconnect circuitry.

Figure 14:
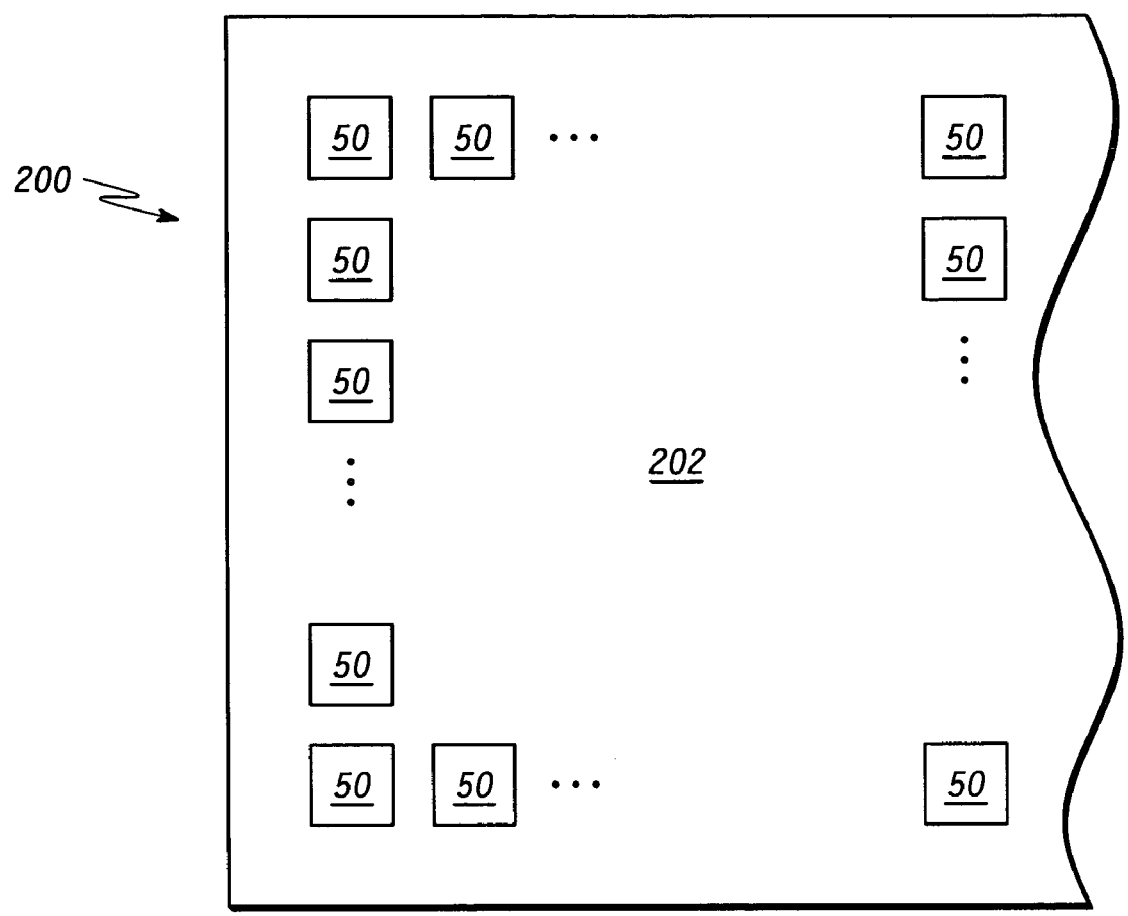
FIG. 14 is a top plan view of an integrated circuit including transistor structures according to another embodiment of the present disclosure.

FIG. 14 is a top plan view of an integrated circuit die 200 having a portion 202 that includes transistor structures 50 according to the embodiments of the present disclosure. In one embodiment, the transistor structures 50 include non-memory devices. A substantial number of devices within 202 employ transistor structures 50. Accordingly, the integrated circuit includes a plurality of transistors, each of the plurality of transistors having a transistor structure as described herein. In addition, the structure of the transistor is implemented in at least a majority of transistors of a predetermined conductivity type used to implement a non-memory function in the integrated circuit die.

According to the embodiments of the present disclosure, a method has been disclosed that takes advantage of the benefit of narrow width PFET drive current enhancement without requiring a significant re-design of an integrated circuit chip. In one embodiment, the PFET width is reduced by dividing a wide PFET device into two or more narrower PFET devices, using either a trench or an active enclosure area. In this instance, a total capacitance (i.e., gate capacitance, miller capacitance and junction capacitance) is reduced because of smaller total PFET device width, and drive current will be comparable or even slightly better because the re-design takes advantage of a strong narrow width PFET device from a <100> SOI substrate. Accordingly, the method provides for a boost in product performance of the corresponding integrated circuit.

According to one embodiment, a method of forming a transistor comprises forming a source and a drain within an active region, and forming a gate overlying a channel area of the active region. The channel region separates the source and drain. The method further includes forming at least one stress modifier and capacitive reduction feature extending between the source and the drain and underlying the gate for reducing capacitance associated with the gate, source and drain. The at least one stress modifier and capacitive reduction feature includes a dielectric and is surrounded at least partially by the active region.

Forming of the at least one stress modifier and capacitive reduction feature can include forming the same as a notch positioned around at least one side of the active area in close proximity to the gate. Forming the notch can further includes positioning the notch on two opposing sides of the active area and substantially symmetric to the gate.

In another embodiment, the method further comprises modifying stress in a width direction of the channel area with the at least one stress modifier and capacitive reduction feature. The method further includes forming the width direction of the channel area with a <100> crystal orientation and exerting a compressive stress on the active region with the dielectric, for example, an oxide. In another embodiment, the method includes forming the width direction of the channel area with a <110> crystal orientation and exerting a tensile stress on the active region with the dielectric, for example, a silicon nitride.

In another embodiment, the method further includes implementing a total number of the at least one stress modifier and capacitive reduction feature as a number that is dependent on an overall width of the active region. The total number of the at least one stress modifier and capacitive reduction feature is dependent on an optimum sub-width of the active region. A calculation of optimum performance metrics determines the optimum sub-width of the active region.

According to another embodiment, the method further includes forming at least two stress modifying liners, a first liner surrounding at least a portion of a periphery of the active region and a second liner surrounding at least a portion of a surface of the at least one stress modifier and capacitive reduction feature. The second liner is formed substantially thicker than the first liner for exerting a substantially greater stress than the first liner. The first liner and the second liner can comprise oxide. In addition, forming the at least one stress modifier and capacitive reduction feature includes forming the feature within a region previously occupied by the active region.

According to yet another embodiment, the method further includes providing at least two predetermined transistor building blocks, each of the at least two predetermined transistor building blocks having a sub-width and a side perimeter, and physically joining at least any two of the at least two predetermined transistor building blocks. In addition, the method includes forming the at least one stress modifier and capacitive reduction feature from the side perimeter of each of two adjoining transistor building blocks. In one embodiment, the method includes surrounding a first liner around at least a portion of a periphery of the active region and surrounding a second liner around at least a portion of a surface of the at least one stress modifier and capacitive reduction feature.

Furthermore, the embodiments of the present disclosure provide design layout pattern featuring an array of narrow width PFETs for achieving an integrated circuit and device speed improvement. Such an integrated circuit transistor product speed improvement is obtained through drive current enhancement. Moreover, according to the embodiments of the present disclosure, wide PFET devices are modified into narrower parts to trade drive current benefit with capacitance reduction.

According to another embodiment of the present disclosure, a method for enhancing transistor performance includes applying different oxidations to different regions of active Si isolation to customize stresses for obtaining an enhanced transistor performance. Process steps include, for example, performing multi-step isolation that includes multiple oxidations to create differential stresses. Key components include, for example, an active device region with multiple liner thicknesses. Furthermore, the present embodiment exploits a directional mobility response to stress without the use of exotic materials, exotic processing, or new tools.

In the foregoing specification, the disclosure has been described with reference to various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, the present embodiments can apply to semiconductor device technologies where carrier mobility is crucial to the device performance.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A transistor comprising:
   a source positioned within an active region;
   a drain positioned within the active region;
   a gate overlying a channel area of the active region, the channel region separating the source and drain; and
   at least one stress modifier and capacitive reduction feature disposed within the active region, extending from the source to the drain, and underlying the gate for reducing capacitance associated with the gate, source and drain, wherein the at least one stress modifier and capacitive reduction feature comprises dielectric having a shape that is disposed within and defined at least partially by a portion of the active region corresponding to a previously removed portion of the active region.

2. The transistor of claim 1 wherein the at least one stress modifier and capacitive reduction feature further comprises a notch positioned around at least one side of the active area in close proximity to the gate.

3. The transistor of claim 2 wherein the notch is positioned on two opposing sides of the active area and substantially symmetric to the gate.

4. The transistor of claim 1 wherein the at least one stress modifier and capacitive reduction feature modifies stress in a width direction of the channel area.

5. The transistor of claim 1 wherein the width direction of the channel area is a <100> crystal orientation.

6. The transistor of claim 5 wherein the dielectric is one that exerts a compressive stress on the active region.

7. The transistor of claim 6 wherein the dielectric that exerts a compressive stress on the active region is an oxide.

8. The transistor of claim 1 wherein the width direction of the channel area is a <110> crystal orientation.

9. The transistor of claim 8 wherein the dielectric is one that exerts a tensile stress on the active region.

10. The transistor of claim 9 wherein the dielectric that exerts a tensile stress on the active region is silicon nitride.

11. The transistor of claim 1 wherein a total number of the at least one stress modifier and capacitive reduction feature is dependent on an overall width of the active region.

12. The transistor of claim 1 wherein the total number of the at least one stress modifier and capacitive reduction feature is further dependent on an optimum sub-width of the active region.

13. The transistor of claim 12 wherein the optimum sub-width is determined by a calculation of optimum performance metrics.

14. The transistor of claim 1 wherein the active region further comprises at least two stress modifying liners, a first liner surrounding at least a portion of a periphery of the active region and a second liner surrounding at least a portion of a surface of the at least one stress modifier and capacitive reduction feature.

15. The transistor of claim 14 wherein the second liner is substantially thicker in cross-sectional width than the first liner for exerting a substantially greater stress than the first liner.

16. The transistor of claim 14 wherein the first liner and the second liner further comprise an oxide.

17. The transistor of claim 1 further comprises at least two predetermined transistor building blocks, each of the at least two predetermined transistor building blocks having a sub-width and a side perimeter, wherein when any two of the at least two predetermined transistor building blocks are physically joined, the side perimeter thereof forms the at least one stress modifier and capacitive reduction feature.

18. The transistor of claim 17 wherein the active region further comprises at least two stress modifying liners, a first liner surrounding at least a portion of a periphery of the active region and a second liner surrounding at least a portion of a surface of the at least one stress modifier and capacitive reduction feature.

19. The transistor of claim 17 wherein the width direction of the channel area is a <100> crystal orientation.

20. The transistor of claim 19 wherein the dielectric is one that exerts a compressive stress on the active region.

21. The transistor of claim 20 wherein the dielectric that exerts a compressive stress on the active region is an oxide.

22. The transistor of claim 17 wherein the width direction of the channel area is a <110> crystal orientation.

23. The transistor of claim 22 wherein the dielectric is one that exerts a tensile stress on the active region.

24. The transistor of claim 23 wherein the dielectric that exerts a tensile stress on the active region is silicon nitride.

25. The transistor of claim 17 wherein the side perimeter of at least one of the two predetermined transistor building blocks further comprises a notch that determine in part the sub-width.

26. The transistor of claim 1 further comprising a plurality of transistors, each of the plurality of transistors having a structure of the transistor of claim 1, the structure of the transistor of claim 1 being implemented in at least a majority of transistors of a predetermined conductivity type used to implement a non-memory function in an integrated circuit die.

* * * * *